United States Patent
Lee et al.

(10) Patent No.: US 9,012,934 B2
(45) Date of Patent: Apr. 21, 2015

(54) METHOD OF FORMING SEMICONDUCTOR LAYER AND SEMICONDUCTOR LIGHT EMITTING DEVICE

(71) Applicant: Samsung Electronics Co., Ltd., Suwon-si, Gyeonggi-do (KR)

(72) Inventors: Seong Suk Lee, Hwaseong-si (KR); Ok Hyun Kim, Suwon-si (KR); Dong Yul Lee, Yongin-si (KR); Dong Ju Lee, Suwon-si (KR); Jeong Wook Lee, Yongin-si (KR); Heon Ho Lee, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/013,678

(22) Filed: Aug. 29, 2013

(65) Prior Publication Data

US 2014/0159081 A1 Jun. 12, 2014

(30) Foreign Application Priority Data

Dec. 11, 2012 (KR) .......................... 10-2012-0143437

(51) Int. Cl.
*H01L 33/00* (2010.01)
*H01L 33/12* (2010.01)
*H01L 33/22* (2010.01)

(52) U.S. Cl.
CPC .......... *H01L 33/007* (2013.01); *H01L 33/0079* (2013.01); *H01L 33/12* (2013.01); *H01L 33/22* (2013.01)

(58) Field of Classification Search
CPC ................................................... H01L 33/0075
USPC ........................... 257/94, 43; 438/42, 47, 104
See application file for complete search history.

(56) References Cited

U.S. PATENT DOCUMENTS

| 7,115,486 | B2 | 10/2006 | Tadatomo et al. |
| 7,737,429 | B2 | 6/2010 | Kim et al. |
| 8,053,263 | B2 | 11/2011 | Lee et al. |
| 2013/0234178 | A1* | 9/2013 | Mitsugi et al. .................. 257/94 |

FOREIGN PATENT DOCUMENTS

| JP | 2001-350838 A | 12/2001 |
| JP | 2009-009977 A | 1/2009 |
| JP | 4586935 B2 | 11/2010 |
| JP | 4591276 B2 | 12/2010 |
| KR | 10-0695453 B1 | 3/2007 |
| KR | 10-2010-0108094 A | 10/2010 |

\* cited by examiner

*Primary Examiner* — Roy Potter
*Assistant Examiner* — Paul Patton
(74) *Attorney, Agent, or Firm* — McDermott Will & Emery LLP

(57) ABSTRACT

A method of forming a semiconductor layer is provided. The method includes forming a plurality of nanorods on a substrate and forming a lower semiconductor layer on the substrate so as to expose at least portions of the nanorods. The nanorods are removed so as to form voids in the lower semiconductor layer, and an upper semiconductor layer is formed on an upper portion of the lower semiconductor layer and the voids.

20 Claims, 3 Drawing Sheets

METHOD OF FORMING SEMICONDUCTOR LAYER AND SEMICONDUCTOR LIGHT EMITTING DEVICE

CROSS-REFERENCE TO RELATED APPLICATION

This application claims priority from Korean Patent Application No. 10-2012-0143437, filed on Dec. 11, 2012 in the Korean Intellectual Property Office, the disclosure of which is incorporated herein by reference in its entirety.

TECHNICAL FIELD

This invention relates to a method of forming a semiconductor layer and a semiconductor light emitting device.

BACKGROUND

A semiconductor light emitting device is a semiconductor device capable of emitting light of various colors due to the recombination of electrons and electron holes at a junction between p-type and n-type semiconductor layers thereof when current is applied thereto. The semiconductor light emitting device has various advantages such as a relatively long lifespan, low power consumption, superior initial driving characteristics and high vibration resistance as compared with a filament-based light emitting device, such that demand therefor has been continuously increasing.

In particular, a group III nitride semiconductor capable of emitting blue light in a single wavelength region has recently come to prominence. In general, since a group III-element nitride such as gallium nitride (GaN), aluminum nitride (AlN) or the like has excellent thermal stability and a direct transition type energy band structure, the group III-element nitride has received considerable attention as a material for a photoelectric device in a wavelength range from blue to ultraviolet. In particular, blue and green light emitting devices using gallium nitride (GaN) have been applied to various devices in various fields of application such as large scale natural colored flat panel displays, traffic lights, indoor lighting devices, high density light sources, high resolution output systems, optical communications systems, and the like.

A group III-element nitride semiconductor layer is grown on a heterogeneous substrate, including: sapphire having a hexagonal structure, silicon carbide (SiC), silicon (Si), or the like; through a process, such as metal organic vapor phase epitaxy (MOVPE), molecular beam epitaxy (MBE), or the like. However, when a group III-element nitride semiconductor layer is grown on a heterogeneous substrate, cracks in the semiconductor layer or warpage thereof may occur and dislocation may be caused due to differences in lattice constants and coefficients of thermal expansion between the semiconductor layer and the substrate. Such cracks in the semiconductor layer, warpage, and dislocation may deteriorate characteristics of a light emitting device. Thus, a buffer layer has been used to alleviate stress due to differences in lattice constants and coefficients of thermal expansion between the semiconductor layer and the substrate.

However, even with the use of the buffer layer, defects of cracks being generated in the semiconductor layer and substrate breakage caused by the differences in lattice constants and coefficients of thermal expansion between the semiconductor layer and the substrate have still occurred.

SUMMARY

An aspect of the disclosure provides a method of forming a semiconductor layer. The method is capable of growing a semiconductor layer having fewer crystal defects by preventing crack occurrence in the semiconductor layer when the semiconductor layer is formed on a heterogeneous substrate formed of a material different from that of the semiconductor layer.

Another aspect of the disclosure also provides a method of forming a semiconductor layer not significantly affected by the lattice constant and the coefficient of thermal expansion of a substrate, and a semiconductor light emitting device including the semiconductor layer.

According to an aspect of the disclosure, a method of forming a semiconductor layer is provided. The method includes forming a plurality of nanorods on a substrate and forming a lower semiconductor layer on the substrate so as to expose at least portions of the nanorods. The nanorods are removed so as to form voids in the lower semiconductor layer and an upper semiconductor layer is formed on an upper portion of the lower semiconductor layer and the voids.

The nanorods may be made of zinc oxide (ZnO). The forming of the nanorods made of zinc oxide (ZnO) may include growing the nanorods using metal organic chemical vapor deposition (MOCVD) after spin coating a zinc oxide (ZnO) colloid on the substrate.

In the forming of the nanorods made of zinc oxide (ZnO), MOCVD may be performed using diethylzinc (DEZn) as a Zn source and using oxygen gas as an O source may be used.

Intervals between the plurality of nanorods may be formed to be about 10 to 100 nm. The plurality of nanorods may have a uniform shape and may be arranged at regular intervals. The nanorods may be formed to have a length of about 30 to 100 nm and the nanorods may be arranged in a vertical direction with respect to an upper surface of the substrate.

The lower semiconductor layer and the upper semiconductor layer may comprise $Al_xGa_{1-x}N$ ($0 \le x \le 1$).

The forming of the lower semiconductor layer may include supplying at least one of an aluminum (Al) source gas and a gallium (Ga) source gas, and ammonia ($NH_3$) to a reactor after the substrate is loaded into the reactor and is maintained at a temperature within a range of about 400 to 600° C.

The nanorods may be removed under temperature conditions of 650° C. or greater in an ammonia ($NH_3$) atmosphere.

The forming of the upper semiconductor layer on the upper portion of the lower semiconductor layer and the voids may include supplying at least one of an aluminum (Al) source gas and a gallium (Ga) source gas, and ammonia ($NH_3$) to a reactor after the substrate is maintained at a temperature within a range of about 1000 to about 1150° C.

The substrate may comprise at least one selected from a group consisting of silicon (Si), sapphire ($Al_2O_3$), silicon carbide (SiC), $MgAl_2O_4$, MgO, $LiAlO_2$, and $LiGaO_2$.

According to another aspect of the disclosure, a semiconductor light emitting device is provided. The semiconductor light emitting device includes a substrate and a buffer layer formed on the substrate and having a plurality of voids having nanorod shapes. A light emitting structure formed on an upper portion of the buffer layer and the voids, includes a first conductive semiconductor layer, an active layer, and a second conductive semiconductor layer. First and second electrodes are respectively connected to the first and second conductive semiconductor layers.

The voids may be arranged at regular intervals.

According to another aspect of the disclosure, a method of forming a semiconductor light emitting device is provided. The method comprises forming a plurality of nanorods on a substrate and forming a lower semiconductor layer on the substrate. The nanorods are removed and an upper semiconductor layer is formed on the lower semiconductor layer. A light emitting structure is formed on the upper semiconductor layer and. A conductive layer is formed on the light emitting structure, and the lower and upper semiconductor layers and the substrate are removed.

In certain embodiments, an electrode may be formed on a surface of the light emitting structure opposing the conductive layer.

Voids may be formed in the lower semiconductor layer when the nanorods are removed.

The lower and upper semiconductor layers and the substrate may be removed by a laser lift-off method.

in certain embodiments, forming the light emitting structure comprises forming a first conductive semiconductor layer on the upper semiconductor layer, forming an active layer on the first conductive semiconductor layer, and forming a second conductive semiconductor layer on the active layer.

BRIEF DESCRIPTION OF THE DRAWINGS

The above and other aspects, features, and other advantages will be more clearly understood from the following detailed description taken in conjunction with the accompanying drawings.

DETAILED DESCRIPTION

Embodiments of the disclosure will now be described in detail with reference to the accompanying drawings. The invention, however, may be embodied in many different forms and should not be construed as being limited to embodiments set forth herein. Rather, these embodiments are provided so that this disclosure will be thorough and complete, and will fully convey the scope of the inventive concept to those skilled in the art.

FIGS. 1 through 5 are cross-section views illustrating a method of forming a semiconductor layer according to an embodiment of the disclosure.

Figure 1:
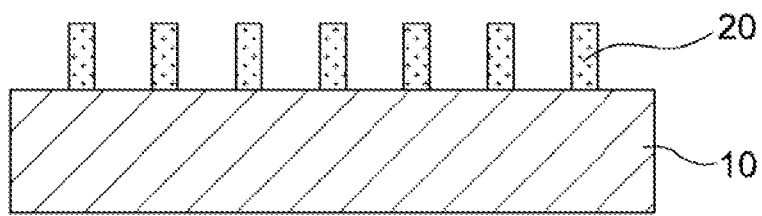
FIGS. 1 through 5 are cross-section views illustrating a method of forming a semiconductor layer according to an embodiment of the disclosure.

First, referring to FIG. 1, a plurality of nanorods 20 may be formed spaced apart from one another on a substrate 10.

The substrate 10 may be provided as a semiconductor growth substrate and may be made of an insulating or a conductive material such as silicon (Si), sapphire, silicon carbide (SiC), $MgAl_2O_4$, MgO, $LiAlO_2$, $LiGaO_2$, or the like. For example, the substrate 10 may be a silicon (Si) substrate and mass production thereof may be facilitated by using the silicon (Si) substrate which is relatively inexpensive and suitable for forming with a large diameter. In addition, the substrate 10 may be made of sapphire having electrical insulation properties. In this case, sapphire is a crystal having Hexa-Rhombo R3c symmetry, of which lattice constants in c-axis and a-axis directions are 13.001 Å and 4.758 Å, respectively. A sapphire crystal has a C-plane (0001), an A-plane (1120), an R-plane (1102), and the like. In this case, since a nitride thin film can be relatively easily formed on the C-plane of the sapphire crystal and the sapphire crystal is stable at high temperatures, sapphire is commonly used as a material for a nitride growth substrate.

The substrate 10 made of typically used silicon, sapphire, or the like as described above, is significantly different from a material grown thereon, for example, a nitride semiconductor, in terms of lattice constant and coefficient of thermal expansion. Thus, a buffer structure capable of alleviating the difference may be employed in order to acquire a high quality semiconductor layer.

Specifically, a buffer structure having a plurality of voids having nanorod shapes between the substrate 10 and a semiconductor layer to be grown thereon may be employed in the embodiment. The nanorods 20 may be provided to form the voids having nanorod shapes and disposed spaced apart from one another on the substrate 10. In addition, each of the nanorods 20 may have a rod shape; however, they are not limited thereto and may be modified to have various shapes.

Methods of forming the nanorods 20 may be various and may be implemented using a method such as metal organic chemical vapor deposition (MOCVD), hydride vapor phase epitaxy (HVPE), molecular beam epitaxy (MBE), or the like.

Since the nanorods 20 may be pyrolyzed and removed in an ammonia ($NH_3$) atmosphere in a follow-up process, the nanorods 20 may be made of a material capable of being pyrolyzed in an ammonia ($NH_3$) atmosphere. For example, the nanorods 20 may be made of zinc oxide (ZnO), but are not limited thereto.

Specifically, in the method of forming the nanorods 20 made of zinc oxide (ZnO), the nanorods 20 made of zinc oxide (ZnO) are grown using MOCVD after spin coating a zinc oxide (ZnO) colloid on the substrate 10. When the nanorods 20 made of zinc oxide (ZnO) are formed using MOCVD, diethylzinc (DEZn) may be used as a Zn source for forming the nanorods 20 made of zinc oxide (ZnO) and oxygen gas may be used as an O source.

In this case, density of the nanorods 20 may be controlled according to a concentration of the zinc oxide (ZnO) colloid, a spin coating time, a temperature of the substrate 10 and a source gas concentration. Density of voids, to be formed in the semiconductor layer, may be controlled by controlling the density of the nanorods 20.

When the nanorods 20 are formed to be excessively dense, it may be difficult to form the semiconductor layer on the substrate 10. On the other hand, when the nanorods 20 are spaced relatively far apart from one another, void density may be lowered, such that it may be difficult to reduce a contact area between the semiconductor layer and the substrate, thereby leading to difficulty in forming a semiconductor layer not significantly affected by the lattice constant and the coefficient of thermal expansion of the substrate.

Thus, a distance between the nanorods 20 may be about 10 to 100 nm. In addition, the nanorods 20 may have a diameter of about 10 to 20 nm and a length of about 30 to 100 nm.

The nanorods 20 may be arranged in a vertical direction with respect to an upper surface of the substrate 10, but are not limited thereto. Here, the nanorods 20 may have a uniform shape and may be arranged at regular intervals. When the nanorods are arranged at regular intervals, the voids formed between the substrate 10 and the semiconductor layer grown thereon may have a regular shape. Therefore, crystal defects may be prevented from occurring in the entire area of the semiconductor layer grown on the substrate 10.

Figure 2:
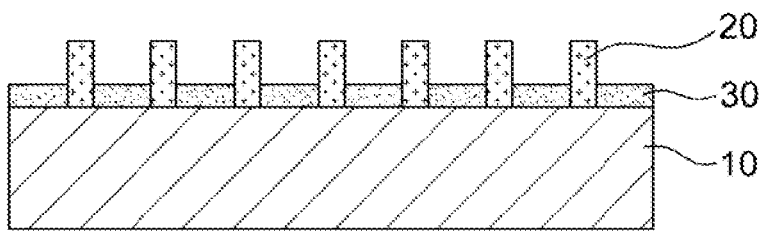

Then, referring to FIG. 2, a lower semiconductor layer 30 formed of a nitride semiconductor, for example, a material having a composition of $Al_xGa_{1-x}N$ ($0 \leq x \leq 1$) is grown on exposed areas of the substrate 10 having the nanorods 20 formed thereon. However, the lower semiconductor layer 30 may also be formed of an AlInGaP-based material, an AlInGaAs-based material or the like.

Specifically, after the substrate 10 having the nanorods 20 formed thereon is loaded into a reactor and maintained at a temperature within a range of about 400 to about 600° C., at least one of an aluminum (Al) source gas and a gallium (Ga) source gas, and ammonia ($NH_3$) are supplied to the reactor. As the source gas, aluminum (Al), trimethylaluminum (TMA), triethyl aluminum (TEA), trimethylamine aluminum (TMAA) ($AlH_3 \cdot N(CH_3)_3$)dimethylethylamine aluminum (DMEAA) ($AlH_3 \cdot N(CH_3)_2(CH_2)H_5$), triisobutyl aluminum (TIBA) ($Al(iso-C_4H_9)_3$) gallium, trimethylgallium (TMG), trimethylgallium (TEG), and like may be used.

In this case, the lower semiconductor layer 30 may be formed to expose at least portions of the nanorods 20. For example, the lower semiconductor layer 30 may be grown to have a height lower than that of the nanorods 20. At least portions of the nanorods 20 may be exposed, such that decomposition of the nanorods 20 may be facilitated in a subsequent process of removing the nanorods 20.

Thereafter, the nanorods 20 are removed. The removal of the nanorods 20 may be performed by increasing a temperature of the substrate 10 and pyrolyzing the nanorods 20 formed on the substrate 10. For example, when the nanorods 20 are made of zinc oxide (ZnO), the temperature of the substrate 10 is increased to 650° C. or greater in an ammonia ($NH_3$) atmosphere, such that the nanorods 20 may be removed. The removal is performed by using pyrolysis characteristics of zinc oxide (ZnO) in an ammonia ($NH_3$) atmosphere at 650° C. or greater. In the case of using pyrolysis, the nanorods may be removed through a temperature rise without undergoing a process of injecting new reaction gas onto the substrate or the like, to allow for process simplification.

Figure 3:
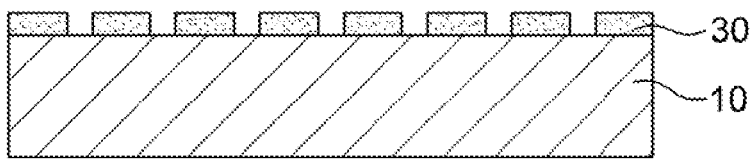

Thus, as illustrated in FIG. 3, the nanorods 20 formed on the substrate 10 may be removed and the lower semiconductor layer 30 may remain on the substrate 10.

Figure 4:
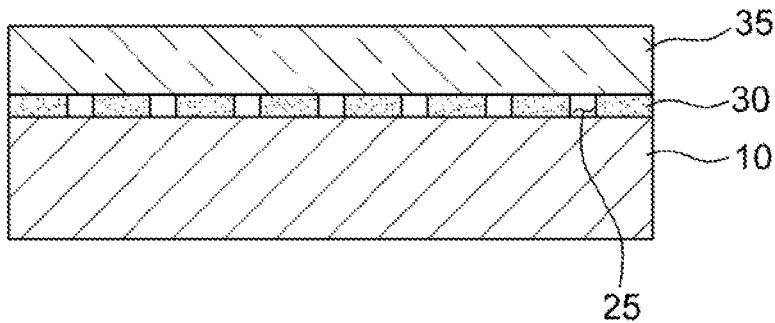

Then, as illustrated in FIG. 4, an upper semiconductor layer 35 is grown on the lower semiconductor layer 30, and the upper semiconductor layer 35 may be made of the same material as that of the lower semiconductor layer 30.

Specifically, the temperature of the substrate 10 is increased while at least one of Al and Ga source gas, and ammonia ($NH_3$) are continuously supplied to the substrate 10. In this case, the temperature of the substrate 10 may be increased to a high level, and, for example, may be increased to and maintained at a temperature within a range of about 1000 to about 1150° C. Accordingly, the upper semiconductor layer 35 made of a material having a composition of $Al_xGa_{1-x}N$ ($0 \leq x \leq 1$) may be grown on the lower semiconductor layer 30.

The upper semiconductor layer 35 is grown on the lower semiconductor layer 30 at a high temperature and accordingly, lateral growth thereof is rapidly ongoing to form the layer. When a semiconductor layer is formed at high temperature as described above, a high quality semiconductor layer may be formed and further, lateral growth thereof may be facilitated. When the upper semiconductor layer 35 is formed through the lateral growth thereof, the upper semiconductor layer 35 may not fill voids 25 formed in the lower semiconductor layer 30.

The voids 25 may allow for a reduction in a contact area between the substrate 10 and the semiconductor layer to be formed on the substrate 10. Thus, stress due to differences in lattice constants and coefficients of thermal expansion between the semiconductor layer and the substrate 10 may be alleviated.

Here, the upper semiconductor layer 35, an undoped semiconductor layer, may serve as an additional buffer, but is not limited thereto. The upper semiconductor layer 35 may form a portion of semiconductor layers of a light emitting structure, which will be formed later.

Figure 5:
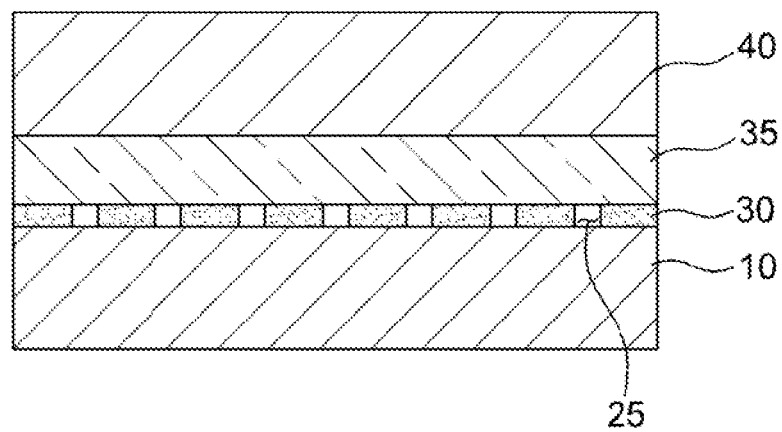

A light emitting structure 40 may be formed on the upper semiconductor layer 35, as illustrated in FIG. 5. The light emitting structure 40 may include a first conductive semiconductor layer, an active layer, and a second conductive semiconductor layer that are sequentially stacked, a first electrode formed on the first conductive semiconductor layer exposed by etching a portion of the active layer and the second conductive semiconductor layer, and a second electrode formed on the second conductive semiconductor layer. In this case, the first conductive semiconductor layer of the light emitting structure 40 may be formed by doping the upper semiconductor layer with impurities.

According to an embodiment of the disclosure, after the nanorods 20 are formed on the substrate 10 and the lower semiconductor layer 30 is formed on the exposed areas between the nanorods 20 on the substrate 10, the nanorods 20 are removed and the upper semiconductor layer 35 is grown on an upper surface of the lower semiconductor layer 30. Thus, the contact area between the substrate 10 and the semiconductor layer to be formed on the substrate 10 may be reduced, whereby a semiconductor layer not affected by the lattice constant and the coefficient of thermal expansion of the substrate 10 may be provided. The semiconductor layer obtained in this manner may have improved crystalline qualities and accordingly, an additional process for preventing the semiconductor layer from being damaged may be omitted.

In addition, since a process of forming the lower semiconductor layer 30 on the substrate 10 having the nanorods formed thereon, and a process of growing the upper semiconductor layer 35 after removing the nanorods 20 may be performed in the same gas atmosphere, a manufacturing process may be simplified.

Meanwhile, the case in which the substrate 10, the lower semiconductor layer 30, and the upper semiconductor layer 35 are provided under the light emitting structure 40 is illustrated in an embodiment. However, the substrate 10, the lower semiconductor layer 30, and the upper semiconductor layer 35 may be removed after forming the light emitting structure 40.

Hereinafter, a method of forming a semiconductor light emitting device including a semiconductor layer according to an embodiment, including removing the lower semiconductor layer and the upper semiconductor layer after forming the light emitting structure, will be described.

In the forming of a semiconductor light emitting device including a semiconductor layer, processes performed until the upper semiconductor layer is formed may be the same as those illustrated in FIGS. 1 through 4.

Figure 6:
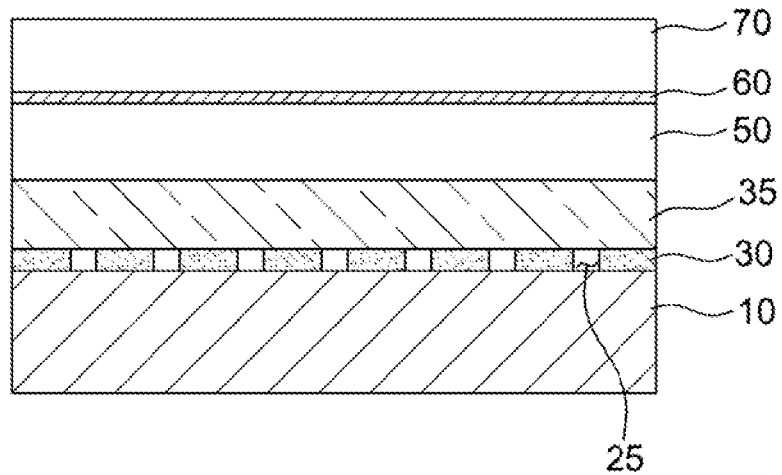
FIGS. 6 through 9 are process cross-sectional views illustrating a manufacturing process of a semiconductor light emitting device including a semiconductor layer according to an embodiment of the disclosure.

According to an embodiment, as illustrated in FIG. 6, a first conductive semiconductor layer 50, an active layer 60, and a second conductive semiconductor layer 70 are sequentially stacked on the upper semiconductor layer 35. In this case, the forming of the first conductive semiconductor layer 50, the active layer 60, and the second conductive semiconductor layer 70 may be continuously performed in the same reactor used to form the upper and the lower semiconductor layers.

Figure 7:
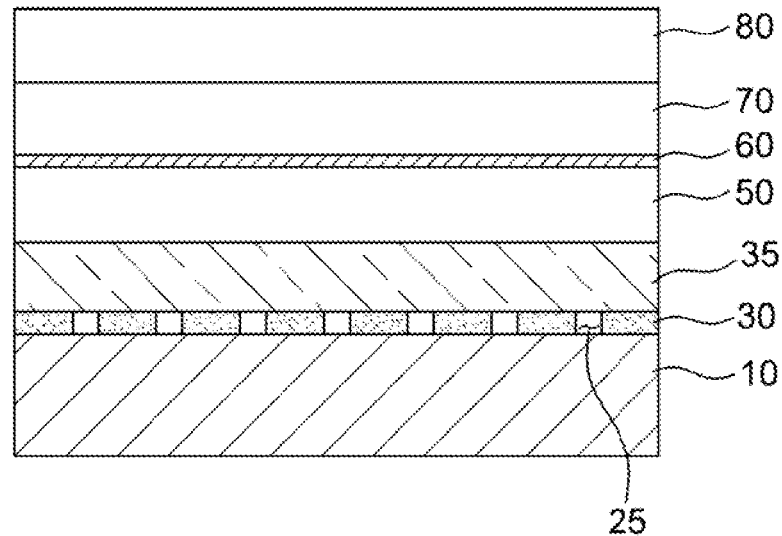

Then, as illustrated in FIG. 7, a conductive substrate 80 may be formed on the second conductive semiconductor layer 70. The conductive substrate 80, an element included in the semiconductor light emitting device which is finally formed, may serve as an electrode, as well as serving as a support supporting the light emitting structure. In this case, the conductive substrate 80 may include a material selected from a group consisting of silicon (Si), copper (Cu), nickel (Ni), gold (Au), tungsten (W), and titanium (Ti).

Figure 8:
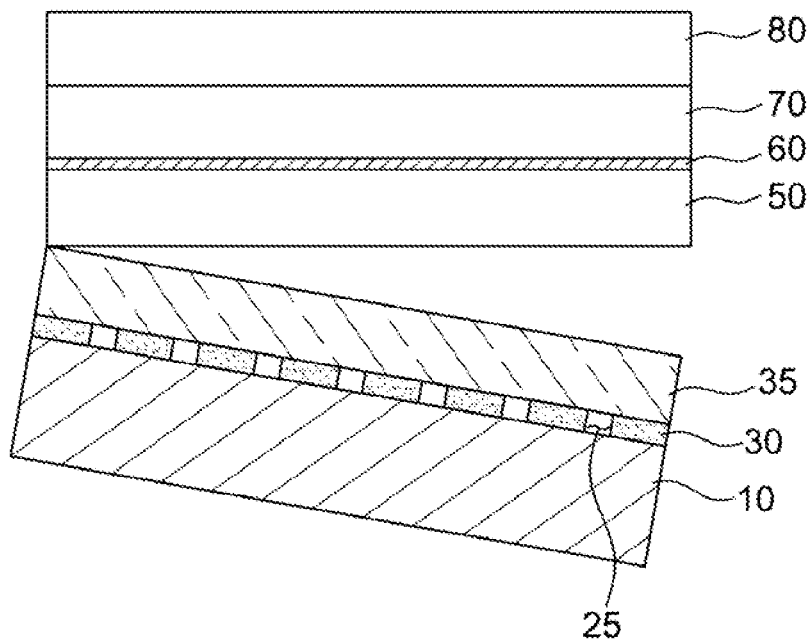

Then, as illustrated in FIG. 8, the substrate 10, the lower semiconductor layer 30, and the upper semiconductor layer 35 are removed to expose the first conductive semiconductor layer 50 to the outside. In the process, a laser lift-off (LLO) method may typically be used, but is not limited thereto. Separation may also be enabled through a mechanical or a chemical process.

Figure 9:
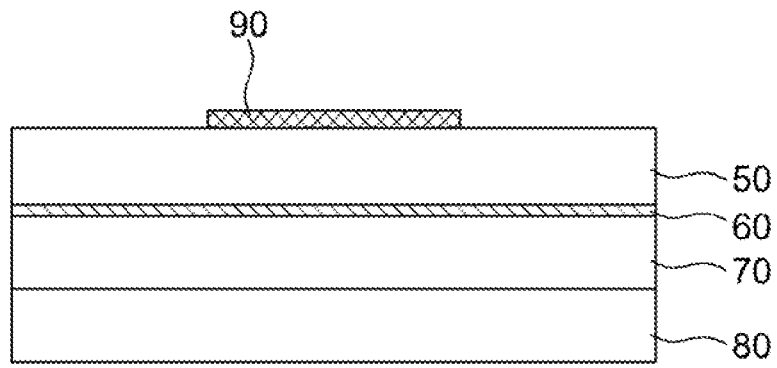

Then, as illustrated in FIG. 9 (which illustrates an overturned structure of FIG. 8), a first electrode 90 is formed on the first conductive semiconductor layer 50 to form the semiconductor light emitting device.

Though the processes as described above, the light emitting structure may be formed on the upper semiconductor layer. Therefore, a semiconductor light emitting device including a semiconductor layer not significantly affected by the lattice constant and the coefficient of thermal expansion of the substrate and having fewer crystal defects may be formed.

Figure 10:
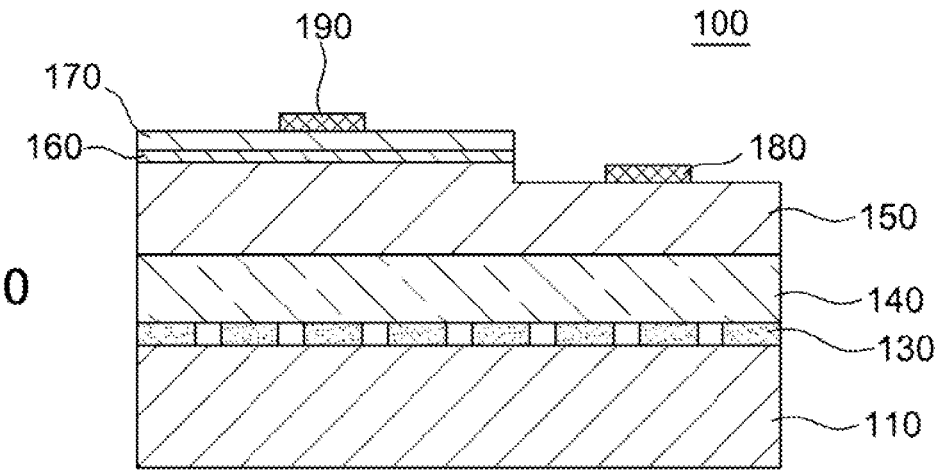
FIG. 10 is a cross-sectional view illustrating a structure of a semiconductor light emitting device including a semiconductor layer according to an embodiment of the disclosure.

FIG. 10 is a cross-sectional view illustrating another structure of a semiconductor light emitting device including a semiconductor layer according to an embodiment. Referring to FIG. 10, a semiconductor light emitting device 100 according to the embodiment may include a lower semiconductor layer 130 formed on a substrate 110, an upper semiconductor layer 140 formed on the lower semiconductor layer 130, a first conductive semiconductor layer 150, an active layer 160, and a second conductive semiconductor layer 170 that are formed on an upper portion of the upper semiconductor layer 140, a first electrode 180, and a second electrode 190.

The substrate 110 may refer to a wafer for manufacturing a nitride semiconductor light emitting device and may be mainly formed of sapphire ($Al_2O_3$) or silicon carbide (SiC), but is not limited thereto. The substrate 110 may be a heterogeneous substrate suitable for growing a nitride semiconductor layer and for example, may be made of silicon (Si), gallium arsenide (GaAs), spinel or the like.

The lower semiconductor layer 130 and the upper semiconductor layer 140 formed through the method of forming a semiconductor layer according to the embodiment may be disposed on the substrate 110.

The lower semiconductor layer 130 and the upper semiconductor layer 140 may be formed of a material having a composition of $Al_xGa_{1-x}N$ ($0 \leq x \leq 1$).

The light emitting structure including the first conductive semiconductor layer 150, the active layer 160 and the second conductive semiconductor layer 170 may be disposed on the upper semiconductor layer 140.

The first conductive semiconductor layer 150, the active layer 160, and the second conductive semiconductor layer 170 are continuously grown in the reactor in which the lower semiconductor layer 130 and the upper semiconductor layer 140 have been grown.

The first electrode 180 may be formed on the first conductive semiconductor layer 150 exposed by etching a portion of the active layer 160 and the second conductive semiconductor layer 170, and the second electrode 190 may be formed on the second conductive semiconductor layer 170.

In addition, a transparent electrode for current distribution may further be formed between the second conductive semiconductor layer 170 and the second electrode 190.

According to the embodiments as described above, a semiconductor light emitting device including a semiconductor layer not significantly affected by the lattice constant and the coefficient of thermal expansion of the substrate and having fewer crystal defects can be formed.

As set forth above, according to certain embodiments, when a semiconductor layer is formed on a heterogeneous substrate made of a material different from that of the semiconductor layer, voids are formed in the semiconductor layer and another semiconductor layer is formed on the semiconductor layer having the voids formed therein to reduce a contact area between the semiconductor layer formed on the substrate and the substrate, whereby a semiconductor layer not significantly affected by the lattice constant and the coefficient of thermal expansion of the substrate can be formed.

While the present invention has been shown and described in connection with the embodiments, it will be apparent to those skilled in the art that modifications and variations can be made without departing from the spirit and scope of the present inventive concept as defined by the appended claims.

What is claimed is:

1. A method of forming a semiconductor layer, the method including:
    forming a plurality of nanorods on a substrate;
    forming a lower semiconductor layer on the substrate so as to expose at least portions of the nanorods;
    removing the nanorods so as to form voids in the lower semiconductor layer; and
    forming an upper semiconductor layer on an upper portion of the lower semiconductor layer and the voids.

2. The method of claim 1, wherein the nanorods comprise zinc oxide (ZnO).

3. The method of claim 2, wherein the forming of the nanorods made of zinc oxide (ZnO) includes growing the nanorods using metal organic chemical vapor deposition (MOCVD) after spin coating a zinc oxide (ZnO) colloid on the substrate.

4. The method of claim 3, wherein in the forming of the nanorods made of zinc oxide (ZnO), MOCVD is performed using diethylzinc (DEZn) as a Zn source and using oxygen gas as an O source.

5. The method of claim 1, wherein intervals between the plurality of nanorods are about 10 to 100 nm.

6. The method of claim 1, wherein the plurality of nanorods have uniform shape and are arranged at regular intervals.

7. The method of claim 1, wherein the nanorods have a length of about 30 to 100 nm.

8. The method of claim 1, wherein the nanorods are arranged in a vertical direction with respect to an upper surface of the substrate.

9. The method of claim 1, wherein the lower semiconductor layer and the upper semiconductor layer comprise $Al_xGa_{1-x}N$ ($0 \leq x \leq 1$).

10. The method of claim 1, wherein the forming of the lower semiconductor layer includes supplying at least one of an aluminum (Al) source gas and a gallium (Ga) source gas, and ammonia ($NH_3$) to a reactor after the substrate is loaded into the reactor and is maintained at a temperature within a range of about 400 to 600° C.

11. The method of claim 1, wherein the nanorods are removed under temperature conditions of 650° C. or greater in an ammonia ($NH_3$) atmosphere.

12. The method of claim 1, wherein the forming of the upper semiconductor layer on the upper portion of the lower semiconductor layer and the voids includes supplying at least one of an aluminum (Al) source gas and a gallium (Ga) source gas, and ammonia ($NH_3$) to a reactor after the substrate is maintained at a temperature within a range of about 1000 to about 1150° C.

13. The method of claim 1, wherein the substrate is made of at least one selected from a group consisting of silicon (Si), sapphire ($Al_2O_3$), silicon carbide (SiC), $MgAl_2O_4$, MgO, $LiAlO_2$, and $LiGaO_2$.

14. A semiconductor light emitting device, comprising:
a substrate;
lower semiconductor layer formed on the substrate and having a plurality of voids having nanorod shapes;
an upper semiconductor layer formed on an upper portion of the lower semiconductor layer and the plurality of voids;
a light emitting structure formed on an upper portion of the buffer layer and the voids and including a first conductive semiconductor layer, an active layer, and a second conductive semiconductor layer; and
first and second electrodes respectively connected to the first and second conductive semiconductor layers
wherein the lower semiconductor layer and the upper semiconductor layer comprise a same material having a composition of $Al_xGa_{1-x}N$ (0≤x<1).

15. The semiconductor light emitting device of claim 14, wherein the voids are arranged at regular intervals.

16. A method of forming a semiconductor light emitting device, comprising:
forming a plurality of nanorods on a substrate;
forming a lower semiconductor layer on the substrate;
removing the nanorods;
forming an upper semiconductor layer on the lower semiconductor layer;
forming a light emitting structure on the upper semiconductor layer;
forming a conductive layer on the light emitting structure; and
removing the lower and upper semiconductor layers and the substrate.

17. The method of claim 16, further comprising forming an electrode on a surface of the light emitting structure opposing the conductive layer.

18. The method of claim 16, wherein voids are formed in the lower semiconductor layer when the nanorods are removed.

19. The method of claim 16, wherein the lower and upper semiconductor layers and the substrate are removed by a laser lift-off method.

20. The method of claim 16, wherein forming the light emitting structure comprises:
forming a first conductive semiconductor layer on the upper semiconductor layer;
forming an active layer on the first conductive semiconductor layer; and
forming a second conductive semiconductor layer on the active layer.

* * * * *